(12) United States Patent
Park

(10) Patent No.: US 6,743,672 B2
(45) Date of Patent: Jun. 1, 2004

(54) METHOD FOR MANUFACTURING A CAPACITOR

(75) Inventor: Jong-Bum Park, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 123 days.

(21) Appl. No.: 10/136,342

(22) Filed: May 2, 2002

(65) Prior Publication Data

US 2002/0179566 A1 Dec. 5, 2002

(30) Foreign Application Priority Data

May 3, 2001 (KR) ........................................ 2001-23992

(51) Int. Cl.$^7$ ........................................ H01L 21/4282
(52) U.S. Cl. ........................ 438/253; 438/256; 438/396
(58) Field of Search ................................ 438/238–241, 438/253–256, 381, 396–399

(56) References Cited

U.S. PATENT DOCUMENTS

| 4,000,046 A | 12/1976 | Weaver |
| 4,104,704 A | 8/1978 | Weaver |
| 4,109,292 A | 8/1978 | Shibayama et al. |
| 5,281,326 A | 1/1994 | Galla |
| 5,855,755 A | 1/1999 | Murphy et al. |
| 5,858,199 A | 1/1999 | Hanak |
| 5,877,062 A | 3/1999 | Horii |
| 5,888,845 A | 3/1999 | Bashir et al. |
| 6,007,652 A | 12/1999 | Hosokawa et al. |
| 6,012,335 A | 1/2000 | Bashir et al. |
| 6,035,714 A | 3/2000 | Yazdi et al. |
| 6,088,216 A | 7/2000 | Laibowitz et al. |
| 6,090,659 A | 7/2000 | Laibowitz et al. |
| 6,165,839 A | * 12/2000 | Lee et al. .................... 438/253 |

* cited by examiner

Primary Examiner—H. Jey Tsai
(74) Attorney, Agent, or Firm—Birch, Stewart, Kolasch & Birch, LLP

(57) ABSTRACT

A method for manufacturing a capacitor including forming an electrode with a top portion having relatively smaller width than its bottom portion. The method includes the steps of: forming a seed layer on a semiconductor substrate; forming a first insulating layer on the seed layer; forming an opening unit which has relatively larger width in a top portion than a bottom portion by selectively etching the first insulating layer and the seed layer; forming a second insulating layer on the seed layer which is exposed after forming the opening unit; removing the first insulating layer using an etching which uses a selective etching ratio between the first insulating layer and the second insulating layer; after removing the first insulating layer, forming a bottom electrode on the exposed seed layer using an electro plating (EP) method; and removing the second insulating layer.

20 Claims, 4 Drawing Sheets

METHOD FOR MANUFACTURING A CAPACITOR

FIELD OF THE INVENTION

The present invention relates to a method for manufacturing semiconductor memory device; and, more particularly, to a method for manufacturing a capacitor.

DESCRIPTION OF THE BACKGROUND ART

Recently, researches for adapting a BST [(Ba,Sr)TiO$_3$] layer, which has a high dielectric constant as an insulating material for a capacitor for a dynamic random access memory (DRAM) of Giga level, have been proceeded.

Especially, a three-dimensional storage node or a concave structure capacitor has been used in a device having a cell size of below 0.10 µm using the BST layer as an insulating material. At this time, materials such as Pt, Ru and Ir, etc., are used as electrodes. When carrying out an etching process using those materials as storage nodes, an etching profile is not better than an SiO$_2$ layer, so it is difficult to adapt those materials to a cell size of below 0.10 µm.

To solve the above-mentioned problems, a capacitor may be manufactured in a concave structure or manufactured by forming a bottom electrode using an electro plating (EP) method. The capacitors are used to store a data within DRAM that is a main memory of a computer, and especially, the capacitor of the present invention may be used in a DRAM that is over a Giga level.

FIGS. 1A to 1D are cross-sectional views illustrating a conventional method for manufacturing a capacitor.

Referring to FIG. 1A, a transistor manufacturing process is carried out on a semiconductor substrate 11. First, a word line (not shown) and a source/drain region 12 are formed on the semiconductor substrate 11. Then, a first SiO$_2$ layer 13 and an Si$_3$N$_4$ layer 14 that are interlayer insulating layers are successively formed on the semiconductor substrate 11. In here, the Si$_3$N$_4$ layer 14 is an etching barrier layer for preventing an etching of the first SiO$_2$ layer 13 when a dry etching process is applied to a seed layer 19 and an adhesion layer 18.

Next, a contact hole, which exposes a predetermined portion of the source/drain region 12, is formed by selectively etching the Si$_3$N$_4$ layer 14 and the first SiO$_2$ layer 13. Subsequently, polysilicon is deposited on the resulting structure including in the contact hole. Then, a polysilicon plug 15 is formed in the contact hole using an etchback process so that the polysilicon plug 15 partly fills the contact hole.

A TiSi$_2$ layer 16 is formed on the polysilicon plug 15 and a first TiN layer 17 is formed on the TiSi$_2$ layer 16, and then the first TiN layer 17 and TiSi2 16 are completely filled into the contact hole using a CMP process. At this time, the TiSi$_2$ layer 16 is formed in an interface between the polysilicon plug 15 and the TiN layer 17 after a predetermined thermal process through depositing the TiN layer 17.

A second TiN layer 18 and a Pt seed layer 19, which function as "adhesive layers," are successively formed on the Si$_3$N$_4$ layer 14 including the first TiN layer 17. A second SiO$_2$ layer 20 is formed on the Pt seed layer 19 as a capacitor oxide layer.

In here, the second TiN layer 18 is used to increase adhesiveness between the Si$_3$N$_4$ layer 14 and a bottom electrode. The Pt seed layer 19 is a seed layer to form a bottom electrode with the EP method and is formed using the physical vapor deposition (PVD) method.

A second SiO$_2$ layer 20 is formed over the Pt seed layer 19 and selectively etched to expose a predetermined portion of the Pt seed layer 19 where a storage node region is formed.

Referring to FIG. 1B, a bias is applied to the Pt seed layer 19 and a Pt bottom electrode 21 is formed on the exposed Pt seed layer 19 using the EP method. Subsequently, the Pt electrode 21 is separated until a surface of the second SiO$_2$ layer 20 is exposed using an etchback or a CMP method, and then the second SiO$_2$ layer 20 is removed.

Referring to FIG. 1C, the Pt electrode 21 is completely separated from other Pt electrodes 21 by selectively etching the Pt seed layer 19 and the second TiN layer 18. At this time, a stacked layer of a Pt seed layer 19A and a second TiN layer 18A remain on the bottom portion of the Pt electrode 21. Further, the Pt electrode 21 has an overhang formation that has relatively larger width on its top portion than that on the bottom portion.

Referring to FIG. 1D, a BST layer 22 is deposited on a resulting structure including the Pt electrode 21 using the chemical vapor deposition (CVD) method and a top electrode 23 is deposited using the CVD method.

In the above-mentioned conventional method, the second SiO$_2$ layer 20, which is a capacitor oxide layer, is etched to form the Pt electrode 21 using an EP and the Pt electrode 21 is formed in the etched portion. At this time, an etching portion of the SiO$_2$ layer 20 may not have a vertical etching profile of 90°, and the SiO$_2$ layer 20 has an overhang formation so that a top portion of a bottom electrode is thicker than a bottom portion (Refer to FIG. 1C).

In case where the above-mentioned structure is adapted in a DRAM device, which is over a Giga level, if a serious overhang results even though a layer is formed by the CVD method, a bad topology is caused, and it may be impossible to have an enough space to deposit a dielectric layer or a top electrode.

Also, a seed layer is needed to form the Pt electrode 21 using the EP method. In other words, in a conventional method, the Pt electrode 21 is formed on a seed layer after the seed layer is deposited using the EP method and an etchback process is carried out to separate the Pt electrodes from each other. Further, the seed layer is separated.

However, if the seed layer is not completely removed during the etchback process, but remains within a residue formation, the Pt electrode 21 is re-deposited on the residue of the seed layer.

This results in the pt layer having bad film characteristics, which cause a problem in forming charges on both sides of the dielectric layer and have effect on characteristics and operations of a capacitor.

SUMMARY OF THE INVENTION

It is, therefore, an object of the present invention to provide a method for manufacturing a capacitor capable of preventing residue in a seed layer and solving difficulty in obtaining a space for depositing a post insulating layer and a top electrode, being caused by an overhang in forming a bottom electrode which is formed through the electro plating (EP) method.

In accordance with one embodiment of the present invention, there is provided a method for manufacturing a capacitor including the steps of: A method for manufacturing a capacitor, comprising the steps of: forming a seed layer on a semiconductor substrate; forming a first insulating layer on the seed layer, the first insulating layer having a first etch property; forming a first opening unit by selectively etching the first insulating layer and the seed layer; forming a second insulating layer having a second etch property in the first opening unit; removing the first insulating layer using an etching which uses a selective etching ratio between the first insulating layer and the second insulating layer so that the seed layer is exposed; forming a bottom electrode on the exposed seed layer using an electro plating (EP) method; and removing the second insulating layer.

In accordance with a second embodiment of the present invention, there is provided a method for manufacturing a capacitor including the steps of: forming a first insulating layer on a semiconductor substrate; forming a contact hole by selectively etching the first insulating layer; filling the contact hole with a plug and a barrier layer over the plug; on the first insulating layer and the barrier layer, forming an adhesive layer, a seed layer and a second insulating layer having a first etch property, successively; forming an opening unit which has relatively small width in a bottom portion than a top portion by selectively etching the second insulating layer and the seed layer; forming a third insulating layer having a third etch property on the exposed seed layer; removing the second insulating layer using an etching which uses a selective etching ratio between the second insulating layer and the third insulating layer; forming a bottom electrode on the exposed seed layer using an electro plating method; removing the third insulating layer; and selectively forming a dielectric layer and a top electrode on the bottom electrode.

In accordance with a third embodiment of the present invention, there is provided a method for manufacturing a capacitor including the steps of: forming a first insulating layer over the semiconductor substrate, the first insulating layer having a first etch property; forming a first opening unit in the first insulating layer so that the first opening has a first portion with a first width and a second portion with a second width relatively larger than the first width; depositing a second insulating material in the first opening, the second insulating material having a second etch property; forming a second opening unit using an etching process which uses a selective etch ratio between the first insulating and the second insulating layer; forming a bottom electrode in the second opening unit; and removing the second insulating material.

These and other objects of the present invention will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE FIGURES

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

FIGS. 2A to 2F are cross-sectional views showing a capacitor manufacturing method in accordance with a preferred embodiment of the present invention.

Figure 1A:
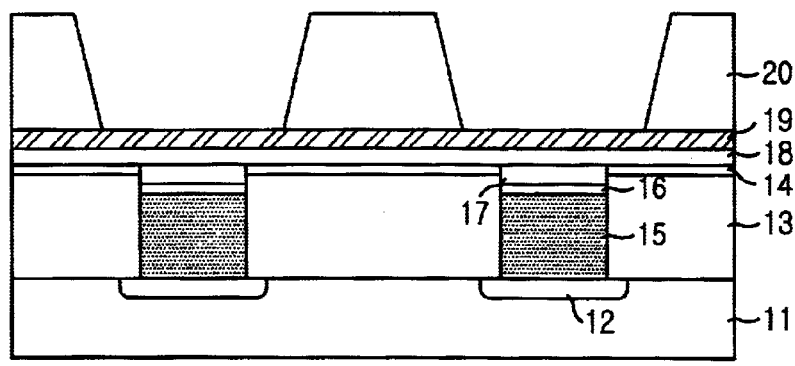
FIGS. 1A to 1D are cross-sectional views illustrating a prior art method for manufacturing a capacitor.
Figure 1B:
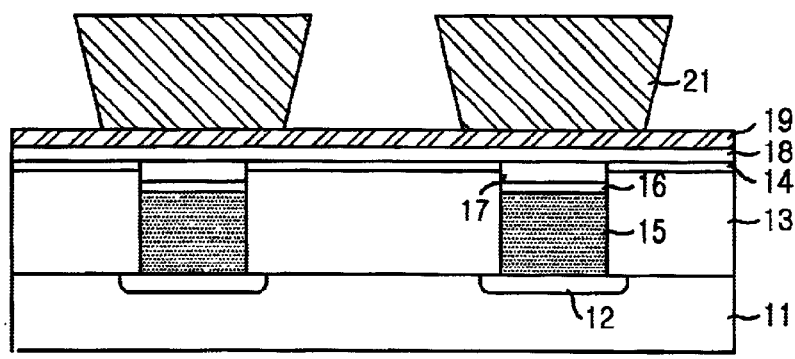
Figure 1C:
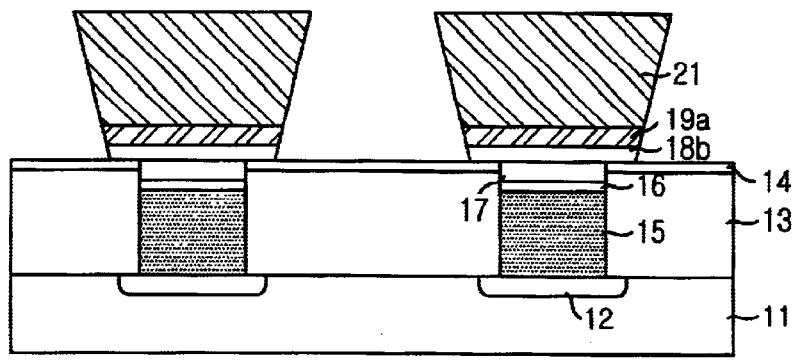
Figure 1D:
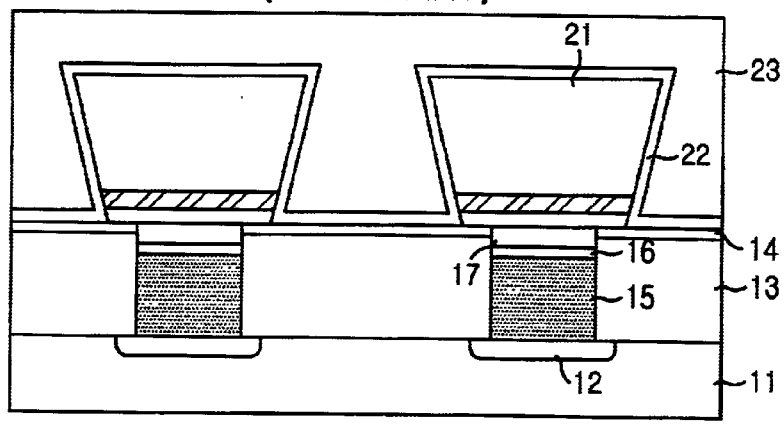
Figure 2A:
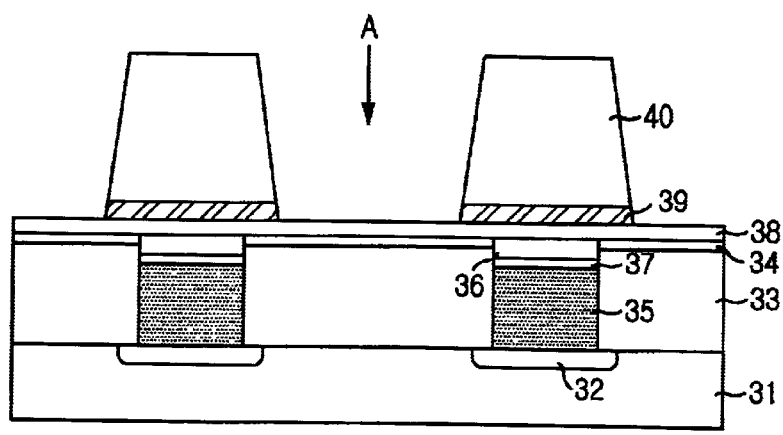
FIGS. 2A to 2F are cross-sectional views showing a method for manufacturing a capacitor in accordance with a preferred embodiment of the present invention.

Referring to FIG. 2A, a transistor manufacturing process is carried out on a semiconductor substrate 31. First, a word line (not shown) is formed on the semiconductor substrate 31 and a source/drain region 32 is formed in the semiconductor substrate 31 at both sides of the word line.

Next, a first $SiO_2$ layer 33 is deposited on the semiconductor substrate 31 as an interlayer insulating layer, and a first $Si_3N_4$ layer 34 is formed on the first $SiO_2$ layer 33 as an etching barrier layer. A contact hole, which exposes a predetermined portion of the source/drain region 32, is formed by selectively etching the first $Si_3N_4$ layer 34 and the first $SiO_2$ layer 33.

Subsequently, a polysilicon layer is deposited on a resulting structure including the contact hole and a polysilicon plug 35, which partially fills the contact hole, is formed using the recess etchback process method.

A $TiSi_2$ layer 37 is formed on the polysilicon plug 35 and a first TiN layer 36 is formed on the $TiSi_2$ layer 37. At this time, the $TiSi_2$ layer 37 and the first TiN layer 36 function as a barrier layer having a stacked structure. The $TiSi_2$ layer 37 is formed in an interface between the polysilicon plug 35 and the TiN layer 36 through a thermal process after depositing the TiN layer 36.

The barrier layer uses a two-dimensional nitride material having good heat-resistance, such as the first TiN layer 36 or a three-dimensional nitride material, i.e., a TiSiN, TiAlN or the like, to increase an oxide-resistance.

The above-mentioned $TiSi_2$ layer 37 forms an ohmic contact between the polysilicon plug 35 and a post bottom electrode, and a stacked barrier layer of the $TiSi_2$ layer 37 and the first TiN layer 36 play a role of a barrier layer against metal and oxygen diffusion.

A non-reactive Ti layer is removed after forming the $TiSi_2$ layer 37. Subsequently, a second TiN layer 38 and a Pt seed layer 39 are successively formed on the first $Si_3N_4$ layer 34 including the first TiN layer 36. In here, the second TiN layer 38 increases adhesiveness between the first $Si_3N_4$ layer 34 and a bottom electrode and is deposited at a thickness of 50 Å to 500 Å. Also, the second TiN layer 38 plays a role of a bias that is needed in forming a Pt electrode using the EP method.

The Pt seed layer 39, which is formed on the second TiN layer 38, is a layer for depositing a bottom electrode, and the Pt is deposited at a thickness of 100 Å to 500 Å by the PVD method.

In addition, a Ru layer formed by the PVD or a CVD method, for example, can be used instead of the Pt seed layer 39.

Next, a second $SiO_2$ layer 40 (or an $Si_3N_4$ layer), as a capacitor oxide layer to determine the height and capacity of a capacitor, is deposited on the Pt seed layer 39 at a thickness of 5000 Å to 20000 Å.

Subsequently, the second $SiO_2$ layer 40 and the Pt seed layer 39 are selectively etched, successively, to expose a region except for the area where a bottom electrode is to be formed, and a first opening A. The opening A is formed so it has a relatively narrower width on its bottom portion than that of its top portion.

The seed layer 39 is etched to separate the electrodes, which are subsequently formed. A re-deposition of a seed layer on a bottom electrode may be avoided by etching the Pt seed layer 39 before forming a Pt electrode using the following EP method. Also, other materials such as Ru, for example, may be used as a seed layer instead of the Pt seed layer 39.

Figure 2B:
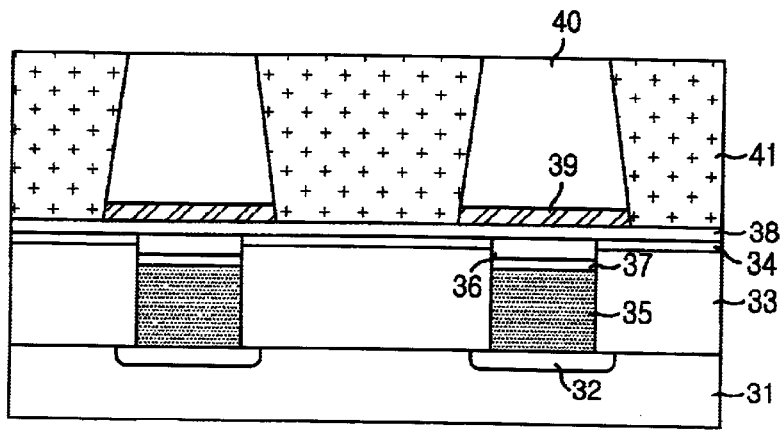

Referring to FIG. 2B, a second $Si_3N_4$ 41 (or other suitable material such as a $SiO_2$ layer) is deposited on a resulting structure including the first opening unit A. At this time, the second $Si_3N_4$ layer 41 (or an $SiO_2$ layer) is filled on the second TiN layer 38 that is exposed on the opening between stacked patterns of the Pt seed layer 39 and the second $SiO_2$ layer 40. An etchback or the CMP process is used on the $Si_3N_4$ layer 41 to form separate sections of the $Si_3N_4$ layer between the stacked portion of the Pt seed layer 39 and the second $SiO_2$ layer 40.

Figure 2C:
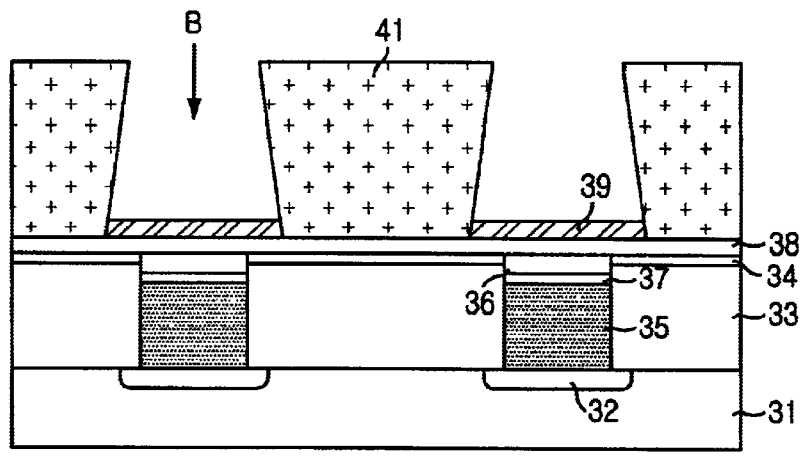

Referring to FIG. 2C, the second $SiO_2$ layer 40(or a $Si_3N_4$ layer) between the second $Si_3N_4$ layer 41 (or $SiO_2$ layer) is removed by a wet etching process.

At this time, the Pt seed layer 39 of the bottom portion of the second $SiO_2$ layer 40 is exposed. The Pt seed layer 39 forms an exposed portion of the stacked structure of the polysilicon plug 35, the $TiSi_2$ layer 37 and the first TiN layer 36. When the second $SiO_2$ layer 40 between the second $Si_3N_4$ 41 layers (or $SiO_2$ layer) is removed by the wet etching process, the selective ratios of the second $SiO_2$ layer 40 and the second $Si_3N_4$ 41 are used.

As shown in FIG. 2C when the second $SiO_2$ layer 40 between the second $Si_3N_4$ layer 41 (or $SiO_2$ layer) is removed by the a wet etching process, a second opening B is formed having a relatively narrower width in its top portion than that of its bottom portion.

Figure 2D:
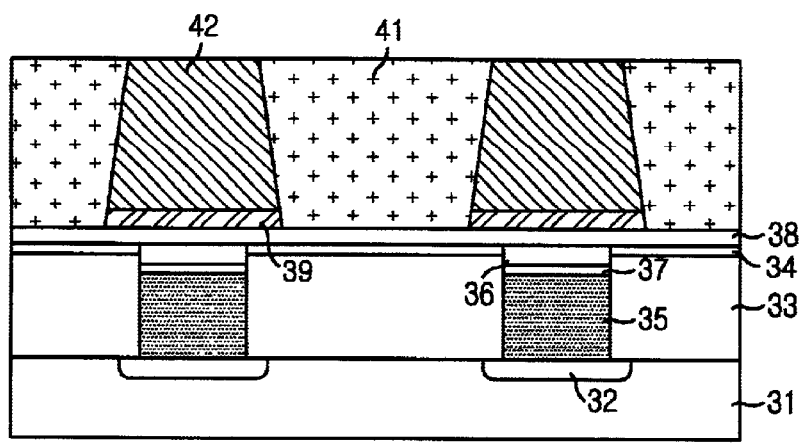

Referring to FIG. 2D, a bias is applied to the second TiN layer 38 which is located at a bottom portion of the Pt seed layer 39 and a Pt layer is plated on the resulting structure using an EP. Next, a Pt layer is separated through the etchback or CMP method to form a Pt electrode 42 that is separated from a neighboring bottom electrode.

At this time, the Pt electrode 42 is formed in the second opening B between the second $Si_3N_4$ layer 41 (or $SiO_2$ layer), so it has relatively narrow width in its top portion than its bottom portion, thereby obtaining an enough space between neighboring Pt electrode 42.

Figure 2E:
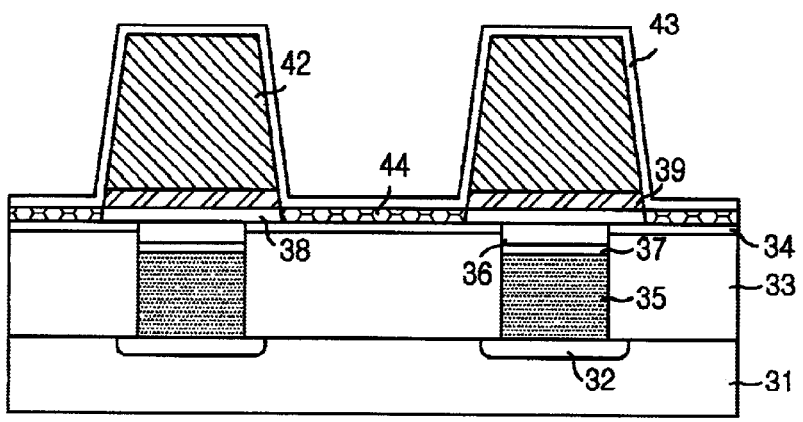

Referring to FIG. 2E, the Pt electrode 42 is completely exposed by wet etching the second $Si_3N_4$ layer 41, and $(Ba,Sr)TiO_3$ (BST) 43 is deposited as a dielectric layer on a resulting structure including the Pt electrode 42, at a temperature of 400° C. to 450° C. using the metal organic chemical vapor deposition (MOCVD) method.

Next, a second step of thermal process is carried out to crystallize the BST 43. First, a first thermal process is carried out at a temperature of 600° C. to 800° C. in a nitride or a vacuum atmosphere to crystallize the BST 43. Subsequently, a rapid thermal process (RTP) is carried out at a pressure of 1 mTorr to 2 mTorr at a temperature of 300° C. to 500° C. in an $O_2$ atmosphere, or a second thermal process is carried out by any one selected from the group including, for example, an $N_2O$ plasma treatment, an $O_2$ plasma treatment and a $UV-O_3$ treatment.

The second TiN layer 38, which is an adhesive layer, performs deposition and thermal process of the BST 43. In particular, the second TiN layer 38 is oxidized into a $TiO_2$ layer 44 to separate the Pt bottom electrodes 42 after externally performing a second thermal process in a low temperature. Therefore, it is not necessary to carry out an additional etchback process to remove the second TiN layer 38.

Meanwhile, instead of oxidizing the second TiN layer 38, which is an adhesive layer in a deposition and thermal process, the second TiN layer 38 may be etched by the etchback process before depositing the BST 43. This is permissible because the second TiN layer 38 has a less serious residue problem than that of the Pt seed layer 39.

If the Pt electrode 42 is formed according to the above-mentioned process, a re-deposition of a residue layer problem as discussed with respect to the background art, brought out during etching a seed layer, may be avoided.

Figure 2F:
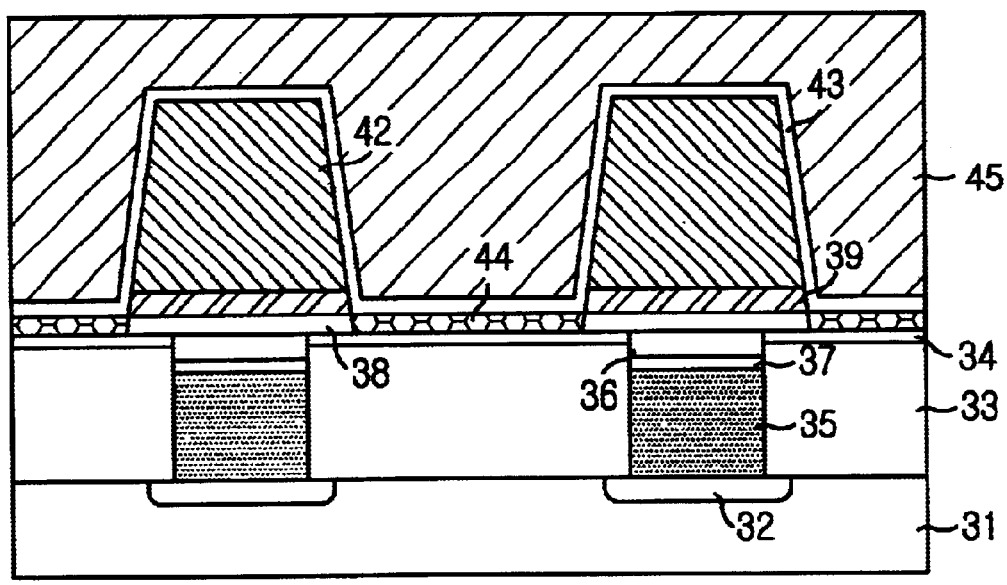

Referring to FIG. 2F, a Ru top electrode 45 is deposited on the BST 43 by the CVD method. Examples of other materials which may be selected from top electrode include a group of $RuO_2$, Pt, Ir and $IrO_2$, etc, which are used in a CVD.

The method for manufacturing a capacitor in accordance with the preferred embodiment of the present invention forms a bottom electrode which has relatively narrow width in its top portion relative to that of its bottom portion so that in case of post insulating layer and a top electrode deposition, an enough space between bottom electrodes can be acquired. Also, pre-etching of a seed layer prevents re-deposition of a residue into bottom electrode during an etchback which is carried out for removing a seed layer. In the case of a BST deposition and a thermal process, an adhesive layer is oxidized by a $TiO_x$ material, thereby preventing residue re-deposition into a bottom electrode and increasing capacitor-operating characteristics.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a capacitor, comprising the steps of:
   a) forming a seed layer on a semiconductor substrate;
   b) forming a first insulating layer on the seed layer, the first insulating layer having a first etch property;
   c) forming a first opening unit by selectively etching the first insulating layer and the seed layer;
   d) forming a second insulating layer having a second etch property in the first opening unit;
   e) removing the first insulating layer using an etching which uses a selective etching ratio between the first insulating layer and the second insulating layer so that the seed layer is exposed;
   f) forming a bottom electrode on the exposed seed layer using an electro plating (EP) method; and
   g) removing the second insulating layer.

2. The method of claim 1, wherein the step g) includes the steps of:
   g1) depositing a dielectric layer on the bottom electrode at a temperature of 400° C. to 450° C.;
   g2) applying a first thermal process to the insulating layer at a temperature of 600° C. to 800° C.;
   g3) applying a second thermal process to the first thermal processed dielectric layer at a temperature of 300° C. to 500° C.; and
   g4) forming a top electrode on the second thermal processed dielectric layer.

3. The method of claim 2, wherein the first thermal process is carried out by a rapid thermal process (RTP) or a vacuum thermal process in a nitrogen atmosphere.

4. The method of claim 2, wherein the second thermal process is performed in an $O_2$ atmosphere by a rapid thermal process (RTP), an $N_2O$ plasma treatment, an $O_2$ plasma treatment or a $UV-O_3$ treatment.

5. The method of claim 1, wherein the first and the second insulating layers include any one material selected from a group including $SiO_2$ and $Si_3N_4$, the first insulating layer is different from second insulating layer.

6. The method of claim 1, wherein the seed layer is composed of Pt or Ru.

7. The method of claim 1, wherein the step c includes an opening unit so that a first portion has a first width and a second portion has a second width that is relatively smaller than the first width.

8. The method of claim 7, wherein the second portion is between the first portion and the semiconductor substrate.

9. The method of claim 1, wherein step f includes forming a bottom electrode with a first portion having a first width and a second portion having a second width that is relatively larger than the first width, wherein the second portion is between the first portion and the substrate.

10. The method of claim 1, wherein step c includes forming a second opening unit with a first portion having a first width and a second portion having a second width that is relatively larger than the first width, wherein the second portion is between the first portion and the substrate.

11. A method for manufacturing a capacitor, comprising the steps of:

a) forming a first insulating layer on a semiconductor substrate;

b) forming a contact hole by selectively etching the first insulating layer;

c) filling the contact hole with a plug and a barrier layer over the plug;

d) on the first insulating layer and the barrier layer, forming an adhesive layer, a seed layer and a second insulating layer having a first etch property, successively;

e) forming an opening unit which has relatively small width in a bottom portion than a top portion by selectively etching the second insulating layer and the seed layer;

f) forming a third insulating layer having a third etch property on the exposed seed layer;

g) removing the second insulating layer using an etching which uses a selective etching ratio between the second insulating layer and the third insulating layer;

h) forming a bottom electrode on the exposed seed layer using an electro plating method;

i) removing the third insulating layer; and j) selectively forming a dielectric layer and a top electrode on the bottom electrode.

12. The method of claim 11, wherein the dielectric layer forming step, further comprises the steps of:

depositing a dielectric layer on the bottom electrode at a temperature of 400° C. to 450° C.;

applying a first thermal process to the dielectric layer at a temperature of 600° C. to 800° C.; and applying a second thermal process to the first thermal processed dielectric layer at a temperature of 300° C. to 500° C. and oxidizing the adhesive layer simultaneously.

13. The method of claim 12, wherein the first thermal process is carried out by a rapid thermal process (RTP) or a vacuum thermal process in a nitrogen atmosphere.

14. The method of claim 12, wherein the second thermal process is performed in an $O_2$ atmosphere by a process selected from a group including a rapid thermal process (RTP), an $N_2O$ plasma treatment, an $O_2$ plasma treatment and a $UV\text{-}O_3$ treatment.

15. The method of claim 11, wherein the seed layer includes any material selected from a group of Pt and Ru materials.

16. The method of claim 11, wherein the second and the third insulating materials are different from each other, and include any material selected from the group including $SiO_2$ and $Si_3N_4$ materials.

17. The method of claim 11, further comprising:

performing an etchback of the exposed adhesive layer, after removing the third insulating layer.

18. A method of forming a capacitor on a semiconductor substrate, the method comprising:

forming a first insulating layer over the semiconductor substrate, the first insulating layer having a first etch property;

forming a first opening unit in the first insulating layer so that the first opening has a first portion with a first width and a second portion with a second width relatively larger than the first width;

depositing a second insulating material in the first opening, the second insulating material having a second etch property;

forming a second opening unit using an etching process which uses a selective etch ratio between the first insulating and the second insulating layer;

forming a bottom electrode in the second opening unit; and removing the second insulating material.

19. The method of claim 18, wherein
the first portion is between the semiconductor substrate and the second portion.

20. The method of claim 18, wherein
the bottom electrode has a third portion with a third width and a fourth portion with a fourth width relatively larger than the first portion and the fourth portion is between the third portion and the semiconductor substrate.

* * * * *